(12) United States Patent
Seuthe

(10) Patent No.: US 10,928,359 B2
(45) Date of Patent: Feb. 23, 2021

(54) METHOD AND DEVICES FOR OBSERVING A MAGNETIC FIELD OF A MATERIAL VOLUME, AND USE OF THE METHOD

(71) Applicant: QASS GmbH, Wetter (DE)

(72) Inventor: Ulrich Seuthe, Wetter (DE)

(73) Assignee: QASS GMBH

( * ) Notice: Subject to any disclaimer, the term of this patent is extended or adjusted under 35 U.S.C. 154(b) by 149 days.

(21) Appl. No.: 15/770,321

(22) PCT Filed: Oct. 28, 2016

(86) PCT No.: PCT/EP2016/001792
§ 371 (c)(1),
(2) Date: Apr. 23, 2018

(87) PCT Pub. No.: WO2017/071812
PCT Pub. Date: May 4, 2017

(65) Prior Publication Data
US 2018/0306748 A1 Oct. 25, 2018

(30) Foreign Application Priority Data

Oct. 28, 2015 (DE) .................. 20 2015 007 470.7
Oct. 26, 2016 (DE) .................. 20 2016 006 620.0

(51) Int. Cl.
| | |
|---|---|
| G01R 29/08 | (2006.01) |
| G01N 27/72 | (2006.01) |
| G01N 27/82 | (2006.01) |
| G01N 27/90 | (2021.01) |

(52) U.S. Cl.
CPC .......... *G01N 27/725* (2013.01); *G01N 27/72* (2013.01); *G01N 27/82* (2013.01); *G01N 27/90* (2013.01)

(58) Field of Classification Search
CPC ...... G01N 27/725; G01N 27/90; G01N 27/72; G01N 27/82
See application file for complete search history.

(56) References Cited

U.S. PATENT DOCUMENTS

| | | | | |
|---|---|---|---|---|
| 6,201,391 B1* | 3/2001 | Burkhardt | ............. | G01N 27/82 324/233 |
| 6,411,085 B1* | 6/2002 | Siegel | .................... | G01N 27/82 324/240 |
| 2013/0079623 A1* | 3/2013 | Rueckert | ............ | G01R 33/1269 600/409 |
| 2013/0221950 A1* | 8/2013 | Lanter | ..................... | G01L 1/122 324/207.2 |
| 2017/0176391 A1* | 6/2017 | Yu | .......................... | G01R 33/10 |
| 2017/0261449 A1* | 9/2017 | Klepel | ................... | G01B 17/04 |

* cited by examiner

*Primary Examiner* — Dominic E Hawkins
(74) *Attorney, Agent, or Firm* — Ulmer & Berne LLP

(57) ABSTRACT

The invention relates to a method for observing a magnetic field of a material volume, in particular for determining properties of a workpiece under, in particular, magnetic, mechanical, thermal, and/or electrical excitation of a material volume of the workpiece, wherein the magnetic field of the material volume is sensed as a function of time and of frequency with high frequency resolution.

11 Claims, 5 Drawing Sheets

25 ms

METHOD AND DEVICES FOR OBSERVING A MAGNETIC FIELD OF A MATERIAL VOLUME, AND USE OF THE METHOD

FIELD OF THE INVENTION

The present invention claims priority on PCT Application No. PCT/EP2016/001792 filed Oct. 28, 2016, which claims priority on German Application Serial Nos. 20 2015 007 470.7 filed Oct. 28, 2015 and 20 2016 006 620.0 filed Oct. 26, 2016. The invention relates to a method and a device for observing a magnetic field of a material volume as well as the use of the device.

BACKGROUND OF THE INVENTION

Inductances or Hall sensors or the like are used to observe a magnetic field of a material volume to determine the properties of a workpiece. In this case, the time variation of the magnetic field in response to a magnetic excitation is recorded. Conclusions on the properties of the workpiece can be drawn from the time variation of the resulting magnetic field.

The methods and devices known from the prior art focus on macromagnetic effects as a function of time.

For example, it is known from U.S. Pat. No. 4,634,976 A to identify material defects by magnetic excitation of a workpiece by evaluating the Barkhausen noise. Comparable prior art is known from U.S. Pat. No. 4,977,373 A and US 20130276546 A1.

In the known methods the macromagnetic effects are only recorded and evaluation in the amplitude-time range.

All the known methods and devices have the disadvantage that the workpiece can only be evaluated inadequately.

SUMMARY OF THE INVENTION

Starting from this, it is the object of the invention to provide a method and a device for observing a magnetic field of a material volume and the use of the device and, in particular, for determining properties of a workpiece under, in particular, magnetic, mechanical, thermal and/or electrical excitation of a material volume of the workpiece. In summary, there is provided a method for observing a magnetic field of a material volume and, in particular, for determining properties of a workpiece under in particular magnetic, mechanical, thermal and/or electrical excitation of a material volume of the workpiece by recording the magnetic field of the material volume as a function of time and of frequency with a high-frequency resolution. A ferromagnetic workpiece can be used and the magnetic field can be recorded during passage through a half of the hysteresis curve, a complete hysteresis curve, or a plurality of successive hysteresis curves. The micromagnetic response to the excitation can be recorded and/or that the frequency and/or time resolution of the excitation and/or the excitation is selected according to the micromagnetic effects in the material volume. The speed of the response to the excitation can be recorded. The excitation can be carried out with a magnetic and/or electrical alternating field and/or static field and/or by means of eddy current induction and/or by a material processing such as, possibly, induction hardening and/or by application of an alternating or direct current and/or by application of an alternating and/or direct voltage and/or by material deformation. The material can be in a fixed position relative to a sensor during the excitation and/or the recording. The material can be moved relative to a sensor and/or an excitation device during the excitation and/or recording. The frequency of the exciting source can be varied, in particular, runs through a frequency range. A plurality of excitation devices and/or a plurality of magnetic field sensors are used. The device for observing a magnetic field of a material volume, in particular, for determining properties of a workpiece under, in particular, magnetic, mechanical, thermal and/or electrical excitation of a material volume of the workpiece can be by a sensor. The excitation device can use electrical, mechanical, thermal and/or magnetic excitation of the workpiece or a material volume of the workpiece. An evaluation device for three-dimensional evaluation of the magnetic field in the frequency-time spectrum can be used. The device can be used for process monitoring, in particular, for examining a continuously supplied and/or produced wire-shaped or flat material or bulk material, in particular, during wire drawing. The device can be used for measuring the hardness and/or strength profile of a surface, in particular a surface of a workpiece having a circular diameter or a weld seam. The device or method can be used to create a correlation of the recorded signal shape with a material property such as possible hardness, internal stress, microstructure, alloy components.

This object is solved by a method and a device for observing a magnetic field of a material volume and the use of the device that uses a sensor to record the magnetic field of the material volume as a function of time and of frequency with a high-frequency resolution.

Accordingly, a method for observing a magnetic field of a material volume, in particular for determining properties of a workpiece under in particular magnetic, mechanical, thermal and/or electrical excitation or the like of a material volume of the workpiece is provided in which the magnetic field of the material volume is recorded as a function of time and of frequency with a high-frequency resolution. As a result of the high-frequency resolution in the time and/or frequency axis, a precise recording of micromagnetic effects is possible which allows more precise qualitative conclusions on the material properties.

Preferably the micromagnetic response to the excitation is recorded.

Furthermore, the speed of the response to the excitation can be recorded.

The frequency and/or time resolution of the excitation and/or the recording is preferably selected according to the micromagnetic effects in the material volume.

The excitation can be carried out with a magnetic and/or electrical alternating field and/or static field and/or by means of eddy current induction and/or by a material processing such as possibly induction hardening and/or by application of an alternating or direct current and/or by application of an alternating and/or direct voltage.

The material can be in a fixed position relative to a sensor during the excitation and/or the recording or the material can be moved relative to a sensor and/or an excitation device.

The frequency of the exciting source can be varied, in particular can run through a frequency range.

A plurality of excitation devices and/or a plurality of magnetic field sensors can be used.

The invention further provides a device for observing a magnetic field of a material volume, in particular for determining properties of a workpiece under magnetic, mechanical, thermal and/or electrical excitation of a material volume of the workpiece, wherein a sensor is provided for recording the magnetic field of the material volume as a function of time and of frequency with a high-frequency resolution.

Preferably an excitation device for electrical and/or magnetic excitation of the material volume of the workpiece is provided.

The invention provides, relates and/or further enables:
- detection of cracks in ferritic materials.
- detection of blowholes or foreign material inclusions in ferritic materials.
- assessment of crystal formation during cooling of ferritic materials.
- application of a magnetization map of a component.
- comparison of the magnetization map of a sample component with other components for assessment of quality.
- detection of hardness defects or hardness changes in materials.
- detection of hardening depth and the hardening gradient on ferritic materials.
- detection of the grain or crystallite structure in iron and other ferritic materials.
- generation of the magnetization of ferritic materials by a magnetic alternating field which is optimized in its time profile to a uniform reorientation sequence of the individual Weiss domains.
- generation of the magnetization by passing the material past a static magnetic field so that all the crystallites experience the same gradient of an external magnetic field.
- calibration of a rapid measurement of the magnetization of ferritic materials with a slower high time resolution measurement for the recording.
- description of the magnetization behaviour of a material volume after a single magnetization.
- description of the mechanical properties of a material volume after a single magnetization.
- description of the magnetization behaviour of a material volume without having reached magnetic saturation in the entire volume.
- determination of alloy components of ferritic material by means of the magnetization properties of individual crystallites.
- application of a combination of short time 1, FFTs and the temporal evaluation thereof to the analysis of the magnetization properties of all Weiss domains located in a material volume.
- application of a combination of short time FFTs and the temporal evaluation thereof to the analysis of the magnetization properties of all Weiss domains located in a material volume which are combined into specific groups ordered according to size and position in the outer magnetic field.
- application of a combination of short time FFTs and the temporal evaluation thereof to generate a magnetization map of a material region or a component.

DESCRIPTION OF THE EMBODIMENTS

Analysis of Magnetic Fields

Figure 1:
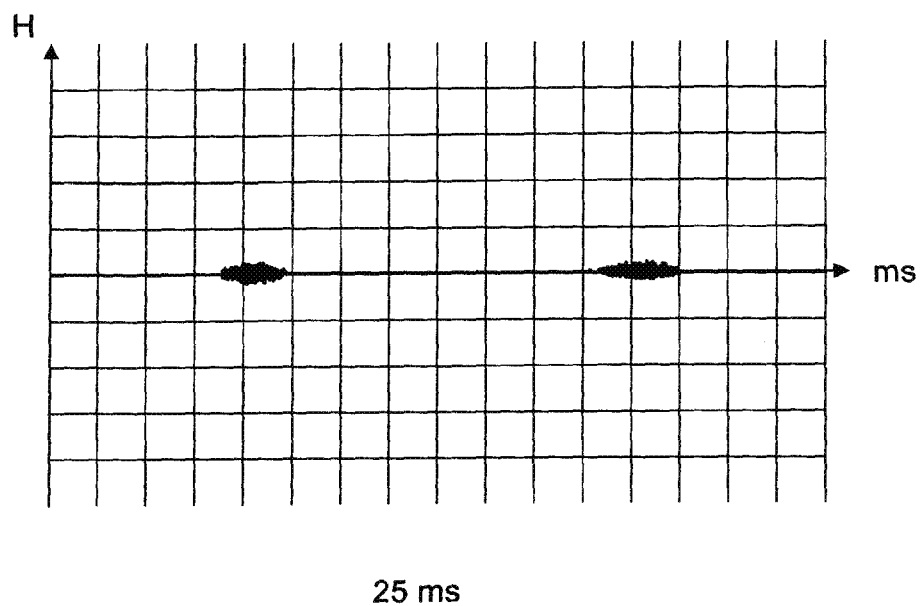
FIG. 1 illustrates a recording of the temporal magnetic field behaviour after a magnetic excitation according to the prior art.

Fluctuations of magnetic fields are analyzed.

The fields are measured using suitable sensors, inductances, Hall sensors etc. The frequency bandwidth of the sensors should be as high as possible. A frequency of up to 1 MHz, 3 MHz, 50 MHz, 100 MHz, 1 GHz, 10 GHz is preferred. The upper limiting frequency correlates with the qualitative resolution, i.e. the higher the limiting frequency, the smaller the magnetic structures which can be recorded. In the GHz range the variation of the magnetic field of individual dipoles can be recorded. In this respect there is a correlation between the upper limiting frequency and the crystallite structure of the material.

The measurement signals are preferably subject to many short time FFTs so that the broad-band frequency dependence can be described at any time and also in its time sequence.

Further transformations which describe the temporal and quantitative magnetic field variations in detail are feasible. An algorithm for the pulse analysis generates the required information.

Expediently around 64 million measured values are evaluated for one measurement. However the ten times higher data set can also be interesting.

Analysis of the Microstructure of Ferrous Materials

Iron as ferromagnetic material forms magnetic dipoles in each Weiss domain.

These dipoles can be reoriented by application of an external magnetic field in the direction thereof. With the swiveling of the microdipoles onto the direction of the external magnetic field, their intensity is increased until ultimately all the microdipoles lie in the direction of the external field.

In order to overcome the magnetic moment present in the microdipole, a certain oppositely directed magnetic field strength is required. The dipoles closest to the field source experience the greatest force. The more microdipoles are reoriented, the greater is the resulting field strength in the direction of the external field.

Thus, further removed microdipoles can also be reoriented.

The variation of the magnetic field generates an electric current whose variation generates an opposite magnetic field. The greater the rate of variation of the external magnetic field, the greater is the induced counter force which slows the re-orientation of the microdipoles at a greater distance.

The effects of the re-orientation of the microdipoles can be resolved with a very sensitive measurement of the magnetic field variations.

As a result of a limitation of the external magnetic field to a specific material volume, predictions can then be made relating to the structure and the properties of this material volume. The effects triggered by further remote structures can be neglected as a result of their small number. Since the Weiss domains, i.e. the material volumes which each have a uniform orientation of the FE electron spin and therefore constitute magnetic dipoles, at the same time also have mechanically interesting properties, some mechanical properties can be concluded from the magnetic properties.

The size distributions of microcrystals in the ferrous material also describe tensile and compressive strengths.

If the precise size and spatial extension of the iron crystallites is known, precise predictions relating to the mechanical properties of the material can be made.

Elements introduced intentionally or unintentionally into the iron vary the mechanical, the electrical and also the magnetic properties of the material.

Carbon-containing steels are widely used when hardened ferrous materials are to be used. The specific distribution of the carbon in the iron, the size distributions of the crystallites, the complete or incomplete incorporation of all available carbon atoms in iron lattices, the presence of elementary carbon in the material etc. also affect the properties of the material.

The same applies to other important alloy elements or interfering elements which unintentionally enter into the material.

Many different methods are used for the analysis.

Compressive and tensile tests of defined cross-sections or areas as well as load tests of finished components.

Microscope examination of material samples to describe the crystal structures and the incorporations of various alloy components.

X-ray, eddy current measurements as examples for non-destructive investigations.

It is known to apply magnetic alternating fields and determine individual magnetic characteristics during repeated passage through magnetic hysteresis curves, i.e. during repeated polarity reversal of an external magnetic field. The characteristics are determined as average values of steady states.

In contrast to this, the evaluation according to the invention is preferably based on the amplitude, time and frequency distribution of a single magnetization. Passage through a half of a hysteresis curve in the frequency-time analysis according to the invention already yields information relating to the material studied. If the hysteresis curve is passed through completely, see FIG. 2 for the example of a sinusoidal magnetic excitation or several passes are recorded, the confidence level of the measurement results increases.

The excitation can be optimized in such a manner that the hysteresis curve is as flat as possible. As a result, the magnetization process lasts longer and is more informative. The invention therefore preferably provides to optimize the excitation curves, in particular adapted to the material.

The confidence level of the measurement results can be increased by repetitions, but here it is a question of reducing the measurement error.

According to the invention, the frequency distribution of the magnetic field variation and the amplitude jumps pertaining to the frequencies can be analyzed and the size distribution of the Weiss domains can be determined from this.

If the scanning speed of the magnetic field variations is greater than the average rate of re-orientation of the individual Weiss domains, an assignment of the individual domains and their size to the location of the magnetic field strength can be made since the domains are initially re-oriented in the region of higher field strengths.

The magnetic field strength or the rate of variation of the field strength can be varied in order to add successive information relating to lower-lying material layers and thus obtain a depth profile of the average sizes of the Weiss domains.

Thus we generate a description of the hardness and strength profiles of the material and a description of the distribution of material faults insofar as they affect the characteristic of the microdipoles.

Example

The average crystallite size is 10 $\mu m^3$. The relevant field size is 4×8 2 mm, i.e. 64 $mm^3$. Then a total of about $64*10^6$ microdipoles are influenced.

At a scanning rate of 100 MHz and a time up to saturation magnetization of one second, the magnetic field increases of the individual dipoles can be described.

The variation of the orientation of the electron spin axis of an individual electron can only be accomplished in certain quantizations.

Neighbouring electrons within a Weiss domain are magnetically aligned onto one another, therefore all have coordinated spin axis directions. When the abrupt rotation of the spin axis of some electrons begins, this results in an accelerated pivoting of all neighbouring electrons which in any case experience a similar external magnetic field strength. Thus, when the rate of this Umklapp process has a maximum, this results in a quasi-impulse-like increase in the magnetic field in the order of magnitude of the magnetic field of the matched Weiss domain relative to the direction of the external magnetic field. Specifically these rapid variations of a Weiss domain which are superposed on the entire magnetic field are recorded by our evaluation.

With an increasing number of matched or largely matched microdipoles, the resulting total magnetic field increases increasingly faster.

As a result of a skilful variation of the external magnetic field, this avalanche effect which is then reflected in the behaviour of the hysteresis curve of the total magnetic field can be compensated so that we achieve an as far as possible linear behaviour of the field strength increase.

Behind this is the preferred intention to achieve the best possible resolution of the Umklapp behaviour of all the crystallites contained in the volume being observed.

Crystallites which have an identical solid angle difference between their inner magnetic field orientation and the external magnetic field and which lie in regions of identical field strength of the external field cannot be distinguished in their rotation behaviour. In addition, they are also subject to the effects of their surrounding crystallites which also vary the magnetic field overall but also in the microrange. Nevertheless, there may be crystallites whose behaviour cannot be separated. In this respect, it also seems appropriate to use measurement results which do not describe the complete resolution but rather sum effects of the magnetic field variations.

The invention can use this approach to carry out a measurement in a significantly shorter time. A compromise is achieved between complete recording of all crystallite influences and a very rapid measurement.

It is also feasible that the high resolution measurement is carried out with new materials and these results are then used to calibrate significantly faster but lower-resolution measurements.

The method requires a magnetic field which varies in the material volume. This can be achieved, for example, by applying a magnetic field whose strength is varied within the desired time interval and/or moving the material through a static magnetic field.

If the crystallite structure (e.g. as a result of different hardness states) of the material should vary, this is reflected in a changed distribution of the magnetic field increase. The invention therefore provides the possibility of also performing measurements on moving materials e.g. within production processes.

The measurement probes can be accommodated in a wire drawing or other stand forming plant in order to analyze the material over its entire length for deviations during the forming and obtain information relating to the actual strengths and other mechanical properties.

By application of repeated measurements, different volume elements of a material can be analyzed, also time variations, e.g. during cooling in a hardening process, can be investigated.

Thus, the falling below the Curie temperature and the sequence of the crystallization effects in the material can be observed.

The measurement probes can be inserted directly in a forming tool for hot forming and hardening of steel sheets and the process of crystallization and therefore hardening can be observed in situ.

In addition to the analysis of the crystallite structure of the material, macroscopic defects such as cracks or blowholes can be detected when these are located in the region of the magnetic field analysis.

As a result of rapid measurements, the invention enables a complete scanning of component surfaces or component layers.

In particular for boundary-layer-hardened steels an analysis as far as the hardening depth is very helpful. Specifically these material regions are particularly stressed both due to the hardening process and also subsequently during use of the component.

For series-manufactured components a magnetic field variation map can be created in each case, which is obtained during scanning of the relevant material layers. The behaviour of each further component can then be compared with this map and deviations recorded immediately.

The method according to the invention is suitable for example for the detection of new hardness zones in polished surfaces such as occur in the manufacture of bearings or gearwheels.

Examples

FIG. 1 illustrates the time behaviour of the magnetic field H after a magnetic excitation by application of a sinusoidally modulated external magnetic field to a ferromagnetic material sample. The AC components of the variations of the resulting magnetic field are shown. (High pass with about 1000 Hz limiting frequency, scanning rate 50 MHz, downsampling to 6 MHz). The sine period can be identified as 50 Hz. A complete passage through the hysteresis characteristic is shown. The prior art methods are restricted to this evaluation.

Figure 2:
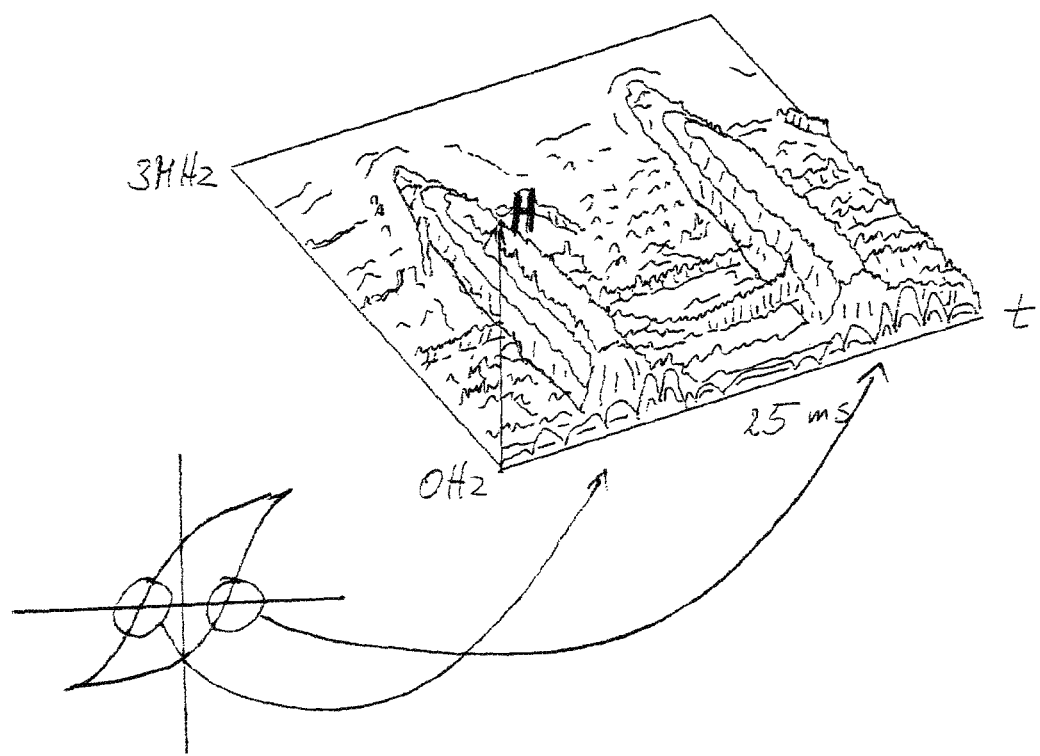
FIG. 2 illustrates a multi-dimensional recording of the magnetic field behaviour according to the invention in the frequency-time diagram.

FIG. 2 is a diagram in the time-frequency range according to the invention with a high-frequency resolution in the frequency range so that micromagnetic effects can be identified. In addition to the two principal emission fields each of which here can be assigned to a magnetic excitation pulse, many typical auxiliary emissions are visible. The frequency-time diagram forms a fingerprint from which conclusions can be drawn on the micromagnetic processes.

Figure 3:
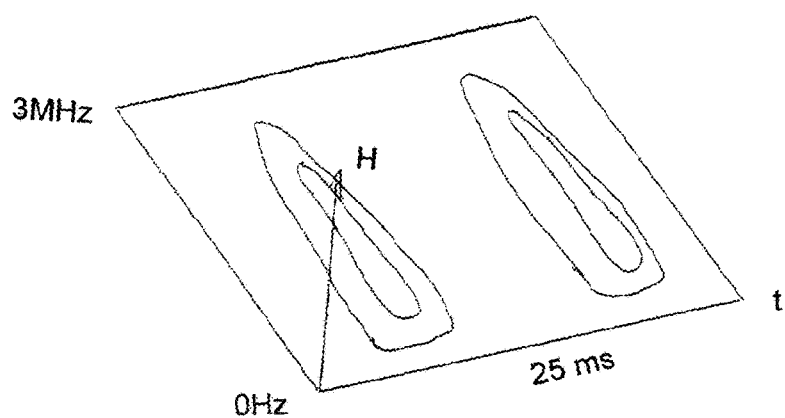
FIG. 3 shows the principal emissions from FIG. 2 with frequency, time and amplitude behaviour.

FIG. 3 shows the principal emissions from FIG. 2 with frequency, time and amplitude behaviour.

Figure 4:
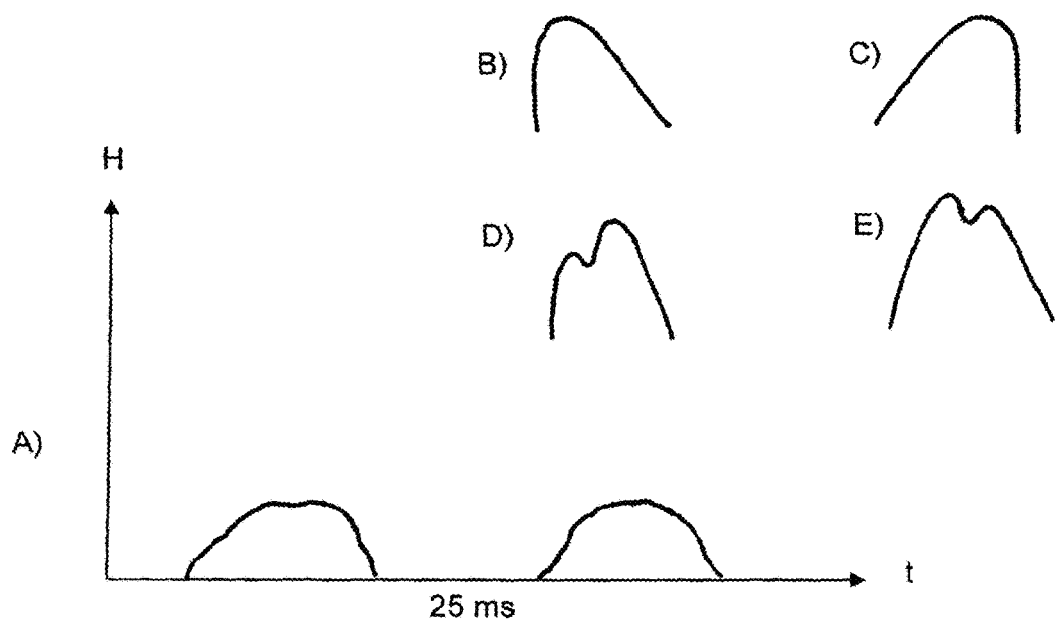
FIG. 4 shows the principal emissions from FIG. 3 with projection on the time axis.

FIG. 4A shows the principal emissions with projection onto the time axis. FIGS. 4B to 4D show alternative signal forms. Thus, in the case of any, even non-magnetic excitation, a conclusion on the material property can be drawn from the signal shape. Whether the signal shape tends to increase more steeply than it decreases, FIG. 4B, or increases flatter than it decreases, FIG. 4C, or has a double (FIG. 4D, 4E) or multiple oscillation is informative for characterizing material, tool or process properties. In particular, information can be obtained from the signal shape, whether projected as in FIG. 4 or in the section in FIG. 2 or evaluated multi-dimensionally as in FIGS. 2, 3, relating to the hardness of the material, the internal stress, the microstructure, alloy components etc.

Figure 5:
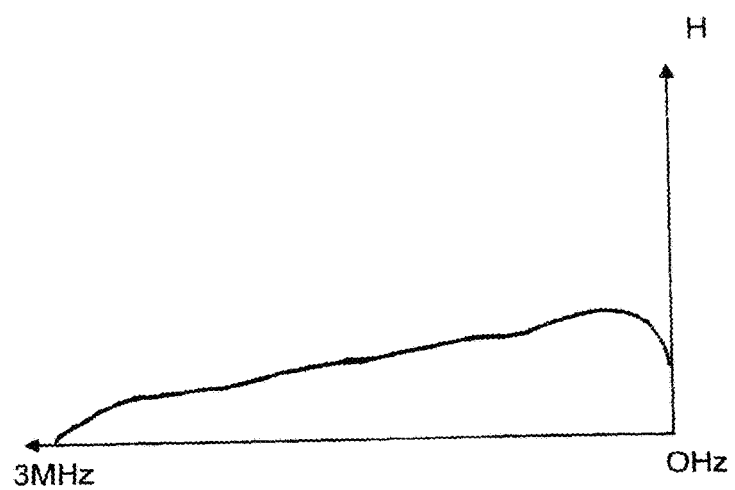
FIG. 5 shows the principal emissions from FIG. 3 with projection on the frequency axis.

FIG. 5 shows the principal emissions with projection onto the frequency axis.

Expediently the frequency of the excitation is varied or selected differently according to the purpose of the evaluation. At high frequency the penetration depth into the material is lower than at low frequency. In this respect it can be expedient to traverse a frequency range during the excitation in order to record material properties depending on the depth of the material.

Figure 6:
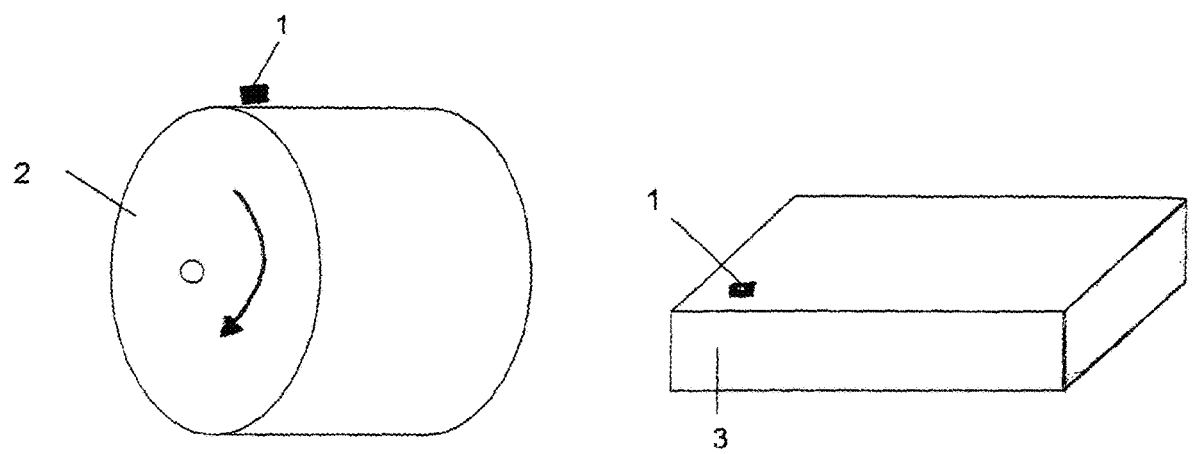
FIGS. 6 to 9 show further embodiments.

For example, in the exemplary embodiment shown in FIG. 6, the surface of a rotating wheel 2, e.g. a wheel tyre of a tractor or a flat material 3, e.g. a plate, can be scanned by means of a magnetic field sensor 1 whilst creating a material property profile, in particular hardness or strength profile of the respective surface, wherein advantageously the material property can be recorded as a function of the distance from the surface.

The method according to the invention can also be used for assessing weld seams. Thus, by scanning the weld seam an in particular depth-graded conclusion relating to the quality of the weld seam, the strength etc. can be obtained and defects such as cracks can be detected.

The method, devices and uses according to the invention can be used particularly advantageously in process monitoring.

For example, in wire drawing wire 4 which is drawn along an arrow 5 from a wire drawing device can be moved along a magnetic field sensor 6 or a plurality of magnetic field sensors 6' whilst recording a magnetic field of the material volume recorded by the magnetic field sensor. The excitation is expediently provided by a device 7, e.g. in the form of a magnetization 8. A downstream device 7' in the drawing direction 5 can be provided for a demagnetization.

Instead of the wire 4, a flat material, e.g. a sheet 4 can be passed by the magnetic field sensor 6.

Figure 8:
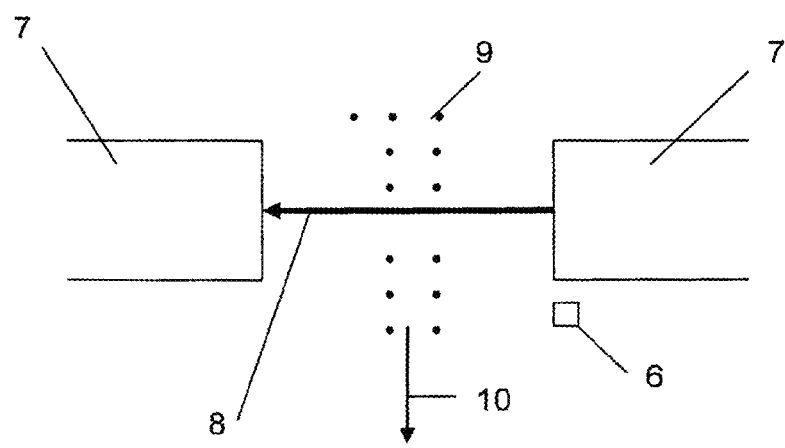

Bulk material 9, possibly screws, can fall through a device 7 along an arrow 10 following gravity and thereby be recorded by a magnetic field sensor 6, see FIG. 8.

Device(s) 7, 7' . . . and magnetic field sensor(s) 6, 6' . . . can be generally arranged along any material paths.

These variants of process monitoring have in common that in a stationary magnetic field sensor arrangement a continuous material flow allows a substantially complete examination. Hardness, density fluctuations of the material, surface corrugations, wire diameter and the like can be recorded.

The excitation which preferably takes place magnetically and/or electrically in the aforesaid examples can also be carried out in other ways.

Figure 9:
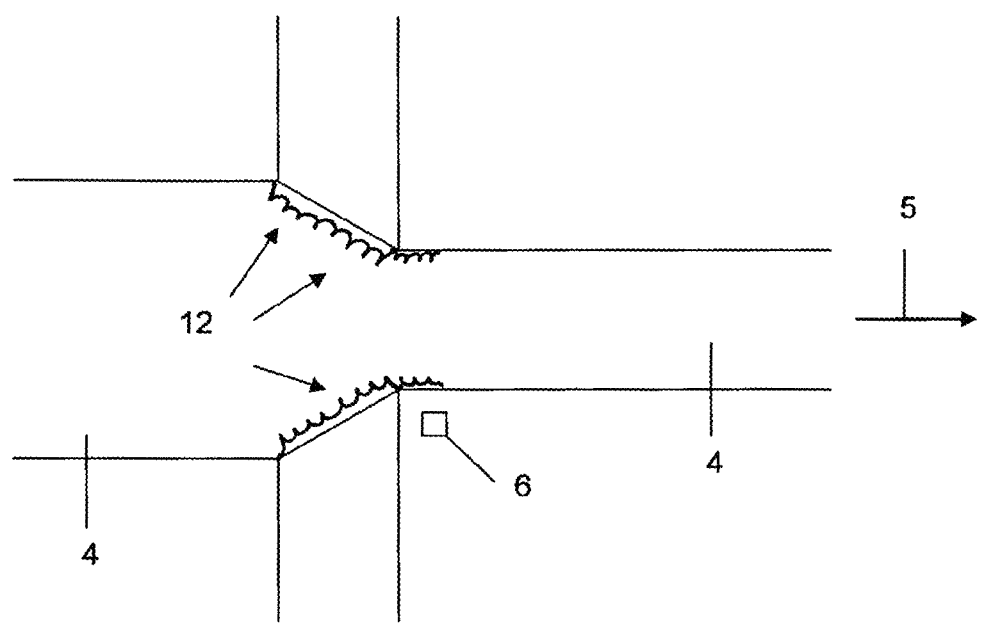

Thus, a mechanical action of a workpiece, in particular a plastic and/or elastic deformation or a machining and the like brings about a detectable magnetic field variation, in particular in ferro- or paramagnetic or metallic material. As an example, FIG. 9 shows a wire drawing device 11 with plastic and optionally elastic deformation 12 and a magnetic field sensor 6. As a result of the recording and evaluation according to the invention of the magnetic field produced as a result of the forming 12, the quality of the forming can be recorded. Also thickness variations, surface waves or defects as well as wire tearing and the like more can also be determined.

Figure 7:
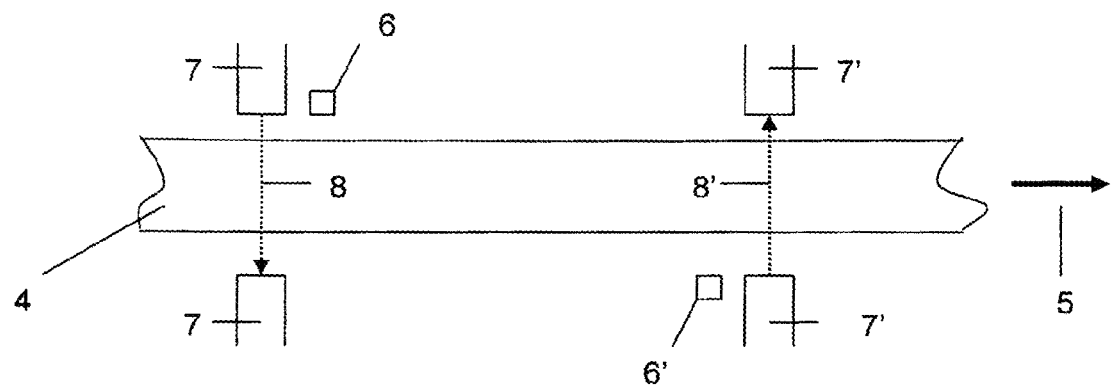

All the embodiments of the invention can preferably be used with ferromagnetic material but also with paramagnetic material or with non-magnetic material. If for example the plate 4 in FIG. 7 is made of plastic, via the device 7 and the sensor 6 on account of the damping behaviour of the plate 4, conclusions can be drawn on the plate with regard to thickness, defects such as holes or material inclusions or density variations or cracks or the like, surface corrugations etc. The invention can also be used in modern composite plastics or plastics mixed with particles. Here, for example, the particle density, the uniformity of the particle distribution, the quality of the composite can be monitored and defects such as any defective joins and peeling in the case of flat composite materials or inclusions or the like can be identified.

A further use is process monitoring during hardening, in particular press hardening. The forming and/or heating of the material is used as excitation in this case. The magnetic field varies during cooling or during forming and after forming. By recording the magnetic field the crystallization processes can be observed and evaluated. Conclusions on the degree of crystallization and the microstructure are possible or the time at which the material can be released from the mould because the hardening process is terminated can be recorded. Furthermore, the already-mentioned information is available as defects (crack formation during cooling, also relating to microcracks, ruptures etc.) and an optimization of the process is also possible by recording the material parameters during a variation of the process parameters temperature, forming pressure, heating rate, cooling rate, temperature profile as a function of time, forming rate or profile etc.

In terms of evaluation technology, the invention preferably provides to work with characteristic vectors. A characteristic vector is in this case an n-tuple of individual values such as frequency distribution, single or multiple peaks, slope of the peaks, magnetic field etc. Such a characteristic vector can be recorded as a model for known properties and then compared with characteristic vectors recorded during the examination in order to determine material and/or process properties.

The invention claimed is:

1. A method for observing a magnetic field in a workpiece to determine a mechanical, thermal and/or electrical property of said workpiece, said method comprising:
    providing said workpiece;
    providing an excitation device configured to cause electrical excitation and/or magnetic excitation in said workpiece;
    providing a sensor configured to sense said electrical excitation and/or said magnetic excitation in said workpiece, said sensor having a scanning rate of at least 1 MHz;
    activating said excitation device to cause said electrical excitation and/or said magnetic excitation in said workpiece;
    causing variations of said electrical excitation and/or said magnetic excitation in said workpiece;
    sensing measured values of said electrical excitation and/or said magnetic excitation in said workpiece by said sensor;
    recording said measured values as a function of time and as a function of frequency; and;
    generating a three-dimensional representation of micromagnetic effects in said workpiece from said measured values, said three-dimensional representation illustrating an amplitude of said magnetic field as a function of time and frequency;
    wherein a) said measured values include measured effects of re-orientation of microdipoles in said workpiece when subjected to a varying magnetic field, b) said measured values include size distribution information and spatial information regarding microcrystals in said workpiece, and include the step of calculating a tensile strength and/or compressive strength of said workpiece based on said size distribution information of said microcrystals in said workpiece, or combination of a) and b).

2. The method as defined in claim 1, wherein said workpiece is at least partially formed of a ferromagnetic material.

3. The method as defined in claim 1, wherein said sensor has a scanning rate of at least 100 MHz.

4. The method as defined in claim 1, wherein said step of causing variations of said electrical excitation and/or said magnetic excitation in said workpiece is achieved by moving said workpiece past said excitation device.

5. The method as defined in claim 1, wherein said measured values are subjected to a plurality of fast Fourier transforms so that a frequency dependence of said measured values can be represented at a time and at a time sequence.

6. The method as defined in claim 1, wherein said measured values include time, frequency, and amplitude information of at least half of a magnetic hysteresis curve.

7. The method as defined in claim 6, wherein said measured values include time, frequency, and amplitude information of one or more magnetic hysteresis curves.

8. The method as defined in claim 1, wherein said measured values include a speed of response to said electrical excitation and/or said magnetic excitation in said workpiece.

9. The method as defined in claim 1, wherein said workpiece is in a form of a wire that has been continuously supplied from a wire drawing process.

10. The method as defined in claim 1, wherein said measured values are used to measure hardness and/or create strength profile of a surface of said workpiece.

11. The method as defined in claim 1, wherein said measured values are used to determine hardness, internal stress, microstructure, and/or alloy components of said workpiece.

* * * * *